United States Patent [19]

Winn

[11] Patent Number: 4,624,557

[45] Date of Patent: Nov. 25, 1986

[54] PHOTOMASK CARRIER AND CONTAINER FOR PHOTOMASK CARRIER

[76] Inventor: Ray Winn, 11803 Addison St., North Hollywood, Calif. 91607

[21] Appl. No.: 701,181

[22] Filed: Feb. 13, 1985

Related U.S. Application Data

[63] Continuation of Ser. No. 518,298, Jul. 28, 1983, abandoned.

[51] Int. Cl.⁴ ............................................. G03B 27/62
[52] U.S. Cl. ..................................... 355/75; 355/122; 355/125
[58] Field of Search .................. 355/75, 122, 125, 126

[56] References Cited

U.S. PATENT DOCUMENTS

| | | | |
|---|---|---|---|
| 280,166 | 6/1883 | Flammang | 354/285 |
| 1,225,957 | 5/1917 | Hollister | 355/122 |
| 1,324,203 | 12/1919 | Maxwell | 355/122 |
| 1,946,810 | 2/1934 | Rowell | 355/75 |
| 2,001,062 | 5/1935 | Grant | 355/75 |
| 2,222,094 | 11/1940 | Talbot | 355/75 |
| 2,444,505 | 7/1948 | Grogan | 355/122 |
| 2,598,911 | 6/1952 | Helberg | 354/285 |
| 4,106,871 | 8/1978 | Roberts | 355/122 |
| 4,445,775 | 5/1984 | Tongel | 355/122 |
| 4,455,082 | 6/1984 | Lepist | 355/75 |

Primary Examiner—Monroe H. Hayes
Attorney, Agent, or Firm—Kendrick, Netter & Bennett

[57] ABSTRACT

An injection-molded photomask carrier includes a base with a round opening of sufficient size and shape to permit light to pass through during a photolithographic process; at least three wall members joined to, upstanding from and framing the periphery of the base to support the edges of a photomask or a photomask/pellicle array resting on the base; a flange projecting inwardly from one of the walls, and a clip on the side of the base opposite the flange for movable engagement with the portions of the photomask or photomask/pellicle combination at its edges. A container for the carrier is complementary in size and shape to the carrier, injection-molded, and includes an injection-molded cover for the container.

13 Claims, 10 Drawing Figures

PHOTOMASK CARRIER AND CONTAINER FOR PHOTOMASK CARRIER

This is a continuation of application Ser. No. 518,298, filed July 28, 1983 now abandoned.

This invention relates to an injection-molded photomask carrier, to a removable frame for reducing the circumference of the carrier to accommodate photomasks of smaller size, and a complementary, injection-molded container/container cover for the carrier.

The injection-molded photomask carrier includes a base having a round opening of sufficient size and shape to permit light to pass through the round opening in a photolithographic process. The carrier includes at least three wall-like members joined to, upstanding from, and framing the periphery of the base. The wall members are sufficiently thick to protect and support the edges of a photomask or of a photomask/pellicle combination resting on the base. Projecting inwardly from one of the three wall-like members, and spaced from and substantially parallel to the base, are flange means for engaging a first portion of the periphery of a photomask, or a photomask/pellicle combination, placed between the flange and the base. The flange is spaced from the base a distance sufficient to permit a photomask or a photomask/pellicle combination whose periphery is between the flange and the base to tilt away from the base without disengaging at its periphery from the flange.

On the opposite side of the base from the flange are movable means for engaging with, and disengaging from another portion of the periphery of the photomask and, in combination with the flange, for holding a photomask or a photomask/pellicle combination firmly on the base. In at least one of the wall members, and extending below the plane of the base a distance sufficient to permit reaching beneath a photomask resting on the base and lifting the photomask away from the base, is a cavity, preferably a round cavity, whose circumference is slightly greater than the tip of a human index or middle finger. At the edge or on the periphery of the carrier are means such as grooves, beveled surfaces, and the like for engaging the carrier with, and disengaging the carrier from alignment mechanisms in photolithographic apparatus. Three or more holes through the base permit insertion of means for modifying the depth of the carrier's mask-seating well. The injection-molded photomask carrier's bottom surface is substantially flat varying less than 0.005 inch across its widest dimension.

My new photomask carrier includes a removable frame for reducing the circumference of the carrier base so that the carrier can accommodate photomasks of smaller circumference than the carrier can without the removable frame in place. The frame has an outer circumference substantially equal to the circumference of the base, and an inner circumference of dimension suitable for receiving a photomask of substantially equal circumference. At the outer edge of one side of the frame are means for engaging the flange means projecting from one of the walls of the carrier. On the opposing side of the frame are means facilitating capture by the movable engaging means on the carrier. The frame includes three or more openings at least partially coincident with the holes in the base of the carrier. These holes allow the insertion of buttons or spacers to accommodate photomasks of differing thicknesses. The frame also includes its own flange projecting inwardly from one of its sides, spaced from and substantially parallel to the base of the carrier, for engaging a first portion of the periphery of a photomask placed between this frame flange means and the frame side. The flange projecting from the frame side is spaced a distance sufficient from the base of the carrier to permit a photomask or a photomask/pellicle combination whose periphery is between the frame flange and the base of the carrier to tilt away from that base without disengaging from the frame flange at the periphery of the photomask or photomask/pellicle combination. On the opposite side of the frame from the frame flange are means for movably engaging with, and disengaging from another portion of a periphery of a photomask resting on the base inside the frame. This engaging means and the flange means projecting from the frame on the opposite side cooperate to hold a photomask or a photomask/pellicle combination inside the frame, on the base of the carrier, and below the plane formed by the top of the walls projecting upwardly from the base of the carrier.

The invention also includes a container for the carrier that is a size and shape complementary to the carrier, is injection-molded, and includes an injection-molded container cover. The container has a width, height and thickness substantially similar to those of the carrier, and has means inside for holding the front and back of the carrier, when placed inside the container, and any photomask or photomask/pellicle combination resting on the base of the carrier, away from the inner wall surfaces of the container. The container has a slanted opening with a complementary slant-profile cover closing thereon. The slant-profile cover preferably has a living, injection-molded hinge, or alternately, a pin-type hinge at one end and an injection-molded, snap-fit hook or finger at its other end. The container itself has an injection-molded projection adjacent the opening of the container for engagement with the snap-fitting hook on the cover when the container cover closes over the opening in the container.

The container includes at least one removable insert for narrowing its width and for adapting its interior to receive carriers of narrower width than the width of the container without the insert in place.

My new photomask carrier, the removable frame for reducing its photomask-receiving circumference, and the complementary injection-molded container/container cover for the new carrier, are better understood by reference to the drawings, in which.

Figure 1:
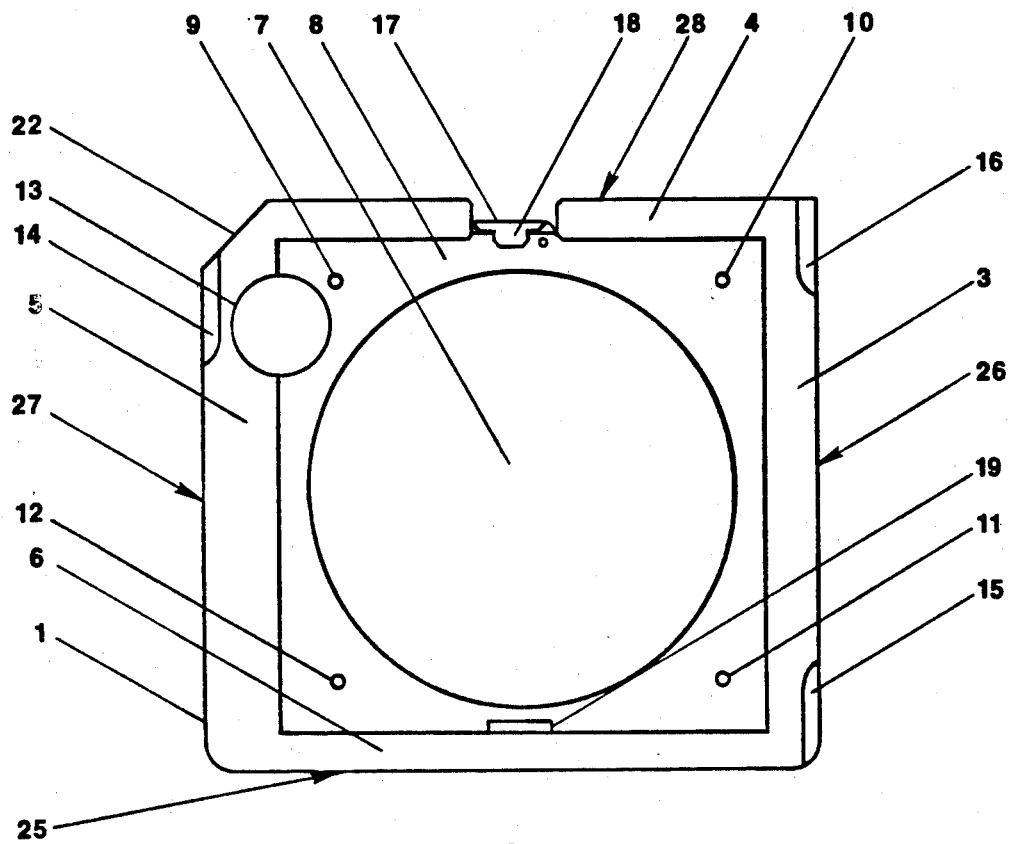
FIG. 1 is a top plan view of the preferred embodiment of my new photomask carrier.
Figure 2:
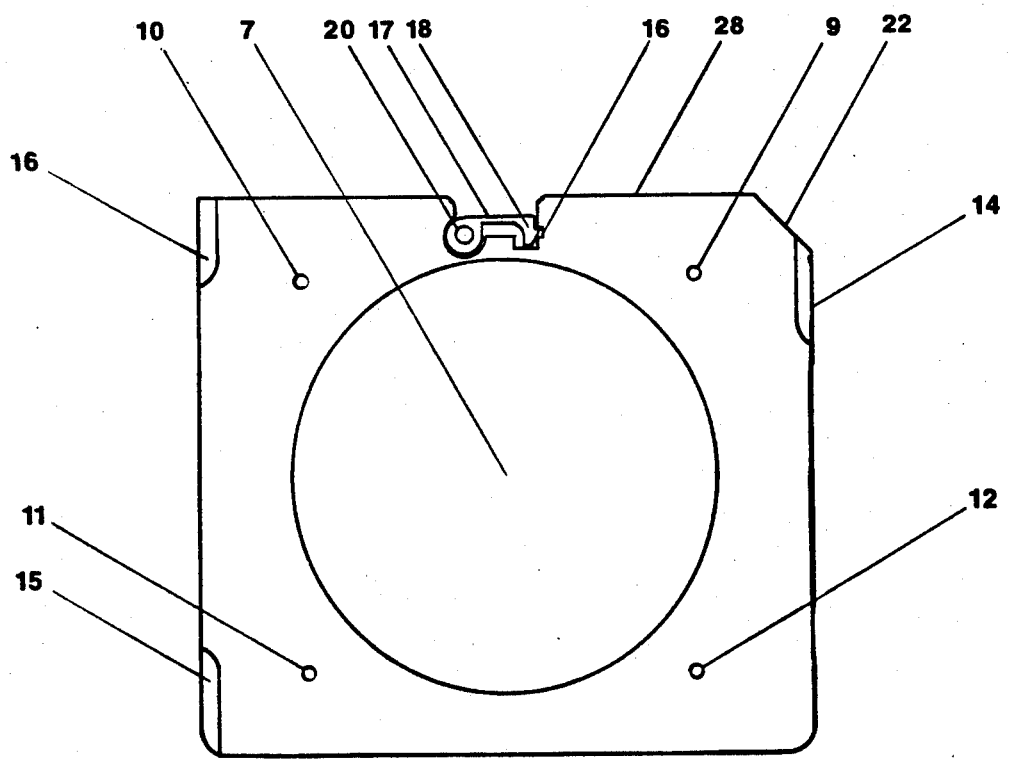
FIG. 2 is a bottom plan view of the carrier shown in FIG. 1.
Figure 3:
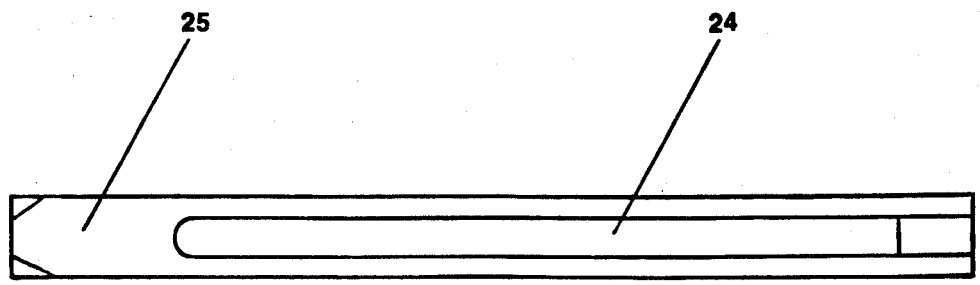
FIG. 3 is an edge view in elevation of the bottom edge of the carrier shown in FIGS. 1 and 2.
Figure 4:
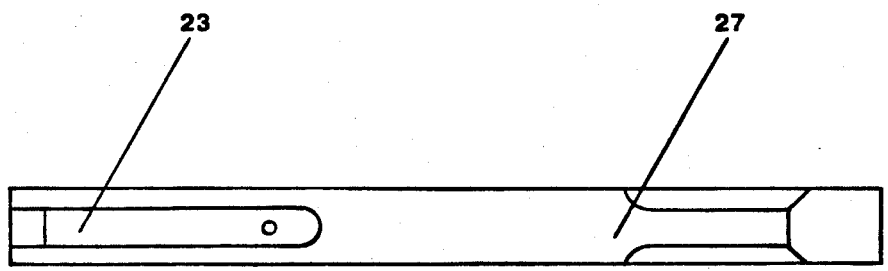
FIG. 4 is an elevation view of the left-side edge of the carrier illustrated in FIG. 1.
Figure 5:
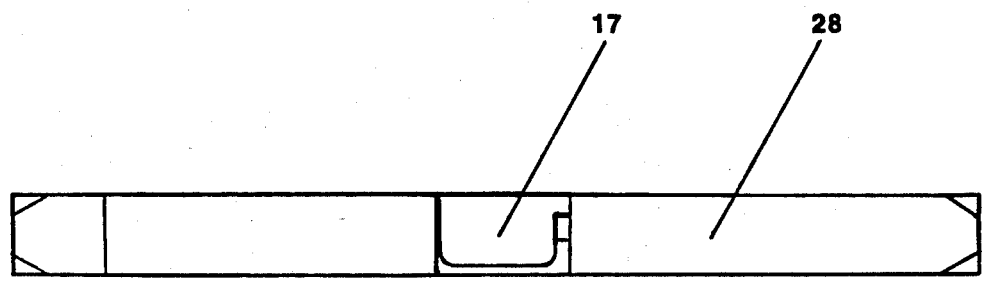
FIG. 5 is an edge view in elevation of the top edge of the carrier shown in FIGS. 1 and 2.
Figure 6:
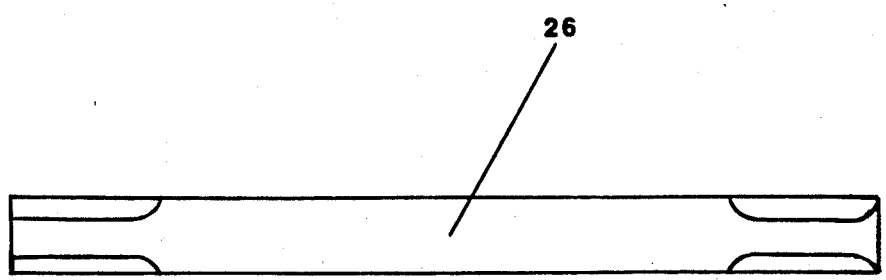
FIG. 6 is an edge elevation view of the right side of the carrier shown in FIG. 1.

FIG. 1 shows the preferred embodiment of my new photomask carrier, generally designated 1, illustrated in FIGS. 1–6. Carrier 1 has a round opening 7 of sufficient size and shape to permit light to pass through in a photolithographic process. Carrier 1 includes integrally-formed base 8 with opening 7 therein. Surrounding base 8 are wall members 3, 6, 5 and 4, that are joined to, upstanding from and serve to frame the periphery of base 8. These wall members are of a thickness sufficient to protect and support the edges of a photomask, or a photomask/pellicle combination, resting on the base. Projecting inwardly from wall 6 is flange means 19. Flange 19 is spaced from and substantially parallel to base 8, and serves to engage a first portion of the periphery of a photomask or photomask/pellicle combination placed between flange 19 and base 8. Flange 19 is spaced a sufficient distance from base 8 to permit a photomask or photomask/pellicle combination whose periphery is between flange 19 and base 8 to tilt away from base 8 without disengaging at its periphery from flange 19. On wall 4 opposite wall 6 and opposite flange means 19 is movable clip means 17 with finger 18 for engaging with, and disengaging from another portion of the periphery of a photomask or a photomask/pellicle combination resting on base 8. Cooperation between clip 17 and flange 19 pins a photomask or photomask/pellicle combination to base 8 between these two retaining members.

Cavity 13, cut partially into wall member 5, extends below the plane of base 8 a distance sufficient to permit reaching beneath a photomask resting on base 8, and lifting such a photomask away from the base manually.

FIGS. 3–6 show such means for engaging the carrier with and disengaging the carrier from alignment means in a photolithographic apparatus as beveled edge 22, beveled surfaces 14, 15 and 16, and edge grooves 23 and 24.

A plurality of holes 9, 10, 11 and 12 through base 8 permit the insertion of pads to adjust for photomasks of differing thicknesses.

As can be seen from FIGS. 1–6, our new carrier has at least three, and upwards of six or eight areas of differing thicknesses, and at least three cross-sectional areas that must be substantially flat. Injection-molding from ABS or other suitable thermoplastic produces a bottom surface that is substantially uniplanar.

Figure 7:
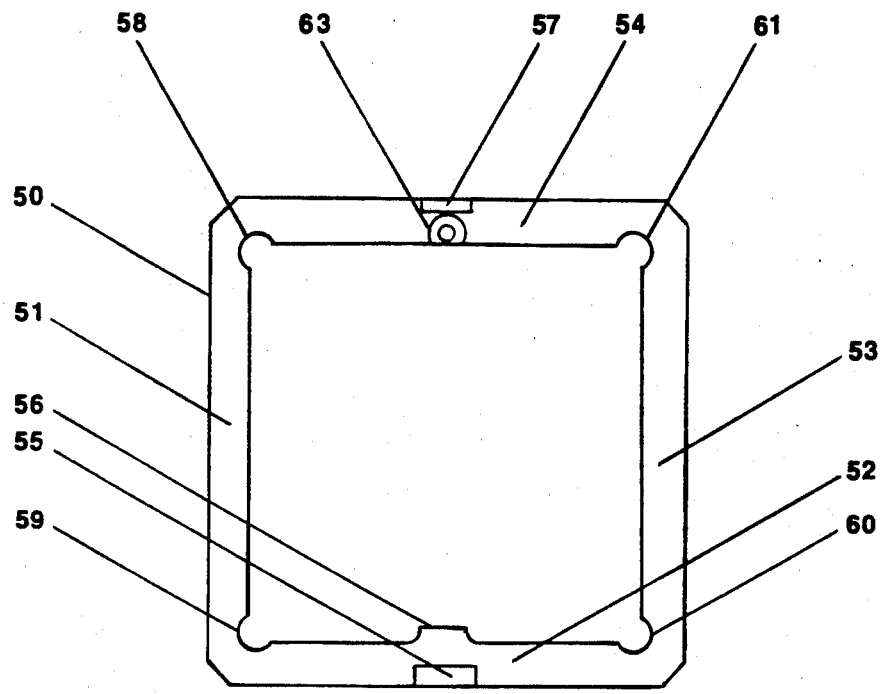
FIG. 7 is a top plan view of the removable frame insert for reducing the circumference of the carrier shown in FIGS. 1–6.

FIG. 7 illustrates a removable frame means for reducing the circumference of the base of the carrier shown in FIGS. 1–6, so that the carrier can accommodate photomasks of smaller circumference than the circumference circumscribed by the inner surfaces of wall members 3, 4, 5 and 6 in FIG. 1. FIG. 7 shows a frame insert generally designated 50 with four frame walls 51, 52, 53 and 54. Frame wall 52 includes groove 55 and flange 56. Groove 55 is of a size and shape to fit between flange 19 and base 8 of the carrier shown in FIG. 1. Similarly, groove 57 in frame wall 54 is of a size and shape suitable for fitting beneath and for capture by clip means 17 on carrier 1.

In practice, frame 50 is inserted into the area circumscribed by walls 3, 4, 5 and 6 in carrier 1 with groove 55 inserted in the space between flange 19 and base 8 and with groove 57 beneath finger 18 of clip 17. Cooperation between clip 17 and flange 19 holds frame 50 in place on base 8 and within the walls surrounding base 8. Openings 58, 59, 60 and 61 serve the same purpose as holes 9, 10, 11 and 12.

Insert 50 includes its own flange 56, projecting inwardly from frame wall 52, and movable clip means 63 on the opposing frame wall for engaging edges or portions of the periphery of a photomask or photomask/pellicle combination placed inside the walls of frame 50 and on the surface of base 8. Flange 56 is parallel to and spaced a distance sufficient from base 8 to permit a photomask whose periphery is placed between flange 56 and base 8 to tilt away from base 8 without disengaging its periphery from flange 62.

Figure 8:
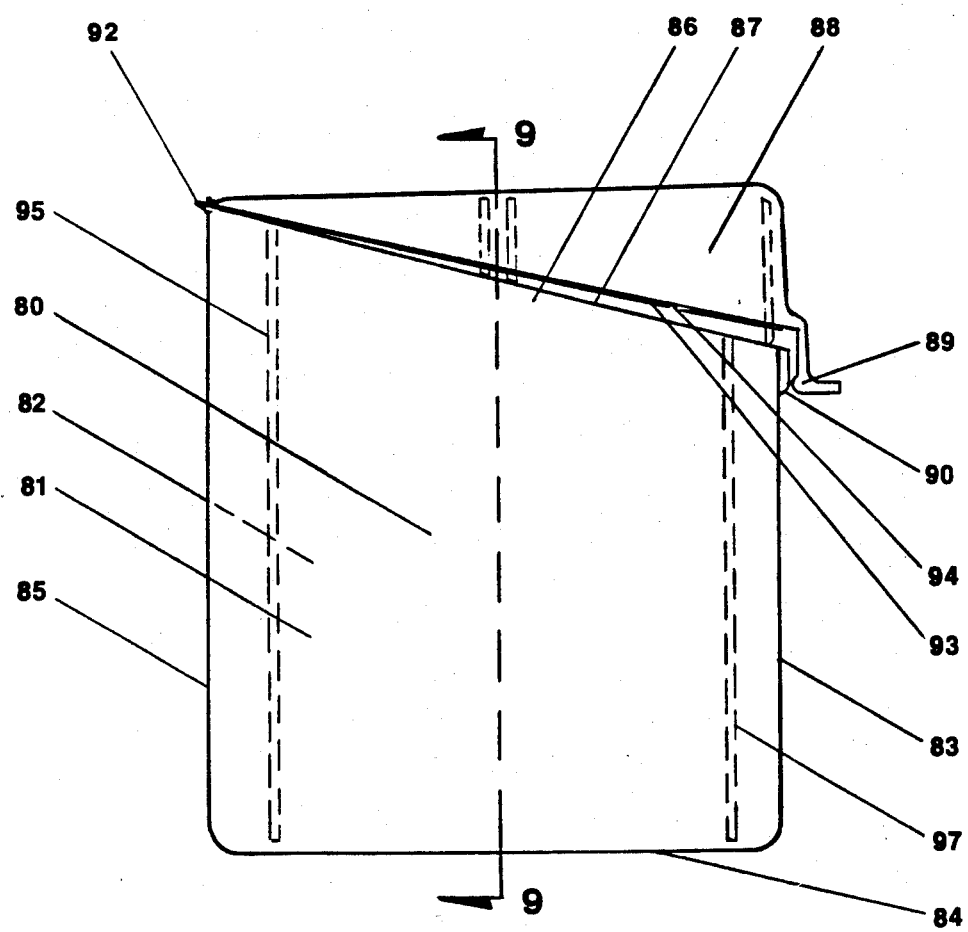
FIG. 8 is a side elevation view of the new integrally molded cover for my new photomask carriers.
Figure 9:
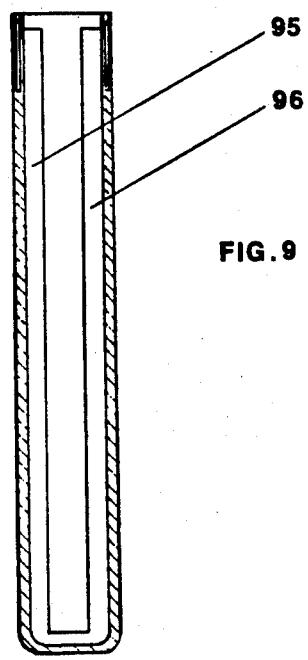
FIG. 9 is a cross-sectional view taken on line 9—9 of FIG. 8 showing means inside the container for holding the front and back of a carrier placed inside the container away from the inner surfaces of the walls of the container.
Figure 10:
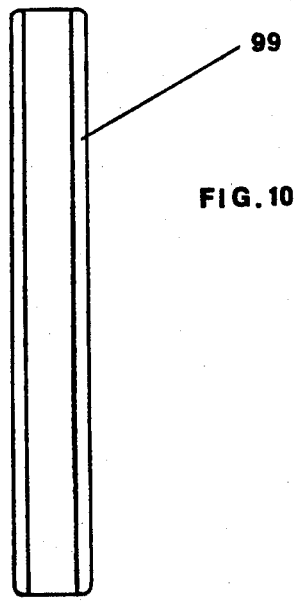
FIG. 10 is a side elevation view of an insert for the container shown in FIG. 8, which functions to reduce the width of the opening inside the container.

FIGS. 8, 9 and 10 illustrate the injection-molded container/container closure for the carrier shown in FIGS. 1–6, with or without the insert shown in FIG. 7. The container has height, width and depth substantially similar to the height, width and depth of the carrier so that the carrier fits snugly within the container. Container 80 includes parallel side walls 81 and 82 and edge walls 83, 84 and 85. Container 80 includes slant-profile opening 86 with double walled groove 87 at its upper edge.

Container 80 includes integrally-molded closure 88, and living hinge 92. Container closure 88 has a complementary slant profile along edge 93 for engagement with slant-profile opening 86 of container 80. Along edge 93 of closure 88 is integrally formed projection 94 for seating in groove 87 atop the edge of opening 86.

Inside container 80 are two pairs of projections joined to, and projecting at right angles from the inner surface of walls 81 and 82. As best seen in FIG. 9, projections 94 and 96 cooperate to hold a photomask carrier or a photomask or photomask/pellicle combination inside the container away from the inner surfaces of its walls 81 and 82.

FIG. 10 shows an insert for narrowing the width of the opening inside container 80. Insert 99 fits between projection 97 and side wall 83; a similar insert may be placed between edge wall 85 of container 80 and projections pair 95, 96 for further narrowing the width of the container.

With container 88 closed over container 80, integrally molded, snap-fitting hook 89 snaps over and engages with the front of projection 90 on wall 83 of container 80, holding container closure 88 snugly in place over container opening 86.

What is claimed is:

1. An injection-molded photomask carrier including a base having a round opening of sufficient size and shape to permit light to pass through in a photolithographic process; at least three wall members joined to, upstanding from and framing the periphery of said base, said wall members having sufficient thickness to protect and support the edges of a photomask or a photomask/pellicle combination resting on said base; flange means projecting inwardly from one of said wall members, and spaced from and substantially parallel to said base, for engaging a first portion of the periphery of a photomask placed between said flange means and said base, said flange means being spaced a sufficient distance from said base to permit a photomask whose periphery is between said flange means and said base to tilt away from said base without disengaging at its periphery from said flange means; means on the side of said base opposite said flange means for movably engaging with, and disengaging from a second portion of the periphery of said photomask and, in combination with said flange means, for holding said photomask on said base; cavity means in at least one of said wall members, and extending below the plane of said base a sufficient distance to permit reaching beneath a photomask resting on said base and lifting said photomask away from said base; means on the periphery of said wall members for engaging said carrier with and disengaging said carrier from alignment means in a photolithographic device; a plurality of holes for receiving means for modifying the depth of the carrier's mask-receiving well; and a substantially uniplanar bottom carrier surface.

2. The carrier of claim 1 further comprising removable frame means for reducing the circumference of said base, said frame means having an outer circumference substantially equal to the circumference of said base; said frame means including means at the outer edge of one frame side for engagement with said flange means, and means on the opposing frame side for capture by said movable engaging means on said carrier, said frame means including openings at least partially coincident with at least one of said plurality of holes in said base, said frame including flange means projecting inwardly from one of its sides, spaced from and substantially parallel to said base, for engaging a first portion of the periphery of a photomask placed between said flange means and said frame side, said frame side being spaced a sufficient distance from said base to permit a photomask whose periphery is between said flange means and said base to tilt away from said base without disengaging at its periphery from said flange means; and means on the side of said frame opposite said frame flange means for movably engaging with, and disengaging from a second portion of the periphery of a photomask resting on the said base inside said frame, said engaging means and said flange means on said frame cooperating to hold said photomask inside said frame and on said base of said carrier.

3. A kit comprising the carrier of claim 1 and a complementary, injection-molded container and container cover for said carrier, said container having a width substantially similar to the width of said carrier, and having means inside said container for holding the front and back of said carrier and any photomask or photomask/pellicle combination resting on the base of said carrier, away from the inner wall surfaces of said container, said container having a slanted opening with a complementary slant-profile cover closing thereon, said slant-profile cover having a living, injection-molded hinge at one end and an injection-molded snap-fit hook at its other end, said container having a projection adjacent the opening of said container of a size and shape complementary with said snap-fit hook for snap-fit engagement with said hook when said container cover closes over the opening in said container.

4. The kit of claim 3 wherein said container has at least one removable insert for narrowing its width and for adapting the interior of said container to receive carriers of narrower width than the width of the container opening without said insert in place inside said container.

5. The kit of claim 3 wherein the height of said container with said container cover in place over the opening of said container is substantially similar to the height of said carrier, whereby said carrier is closely confined when placed within said container and said container cover is closed over the opening in said container.

6. An injection-molded, substantially one-piece photomask carrier including a base having an opening of sufficient size and shape to permit light to pass through in a photolithographic process; means joined to, upstanding from and framing the periphery of said base, said means having sufficient strength to protect and support the edges of a photomask or a photomask/pellicle combination resting on said base; means formed by injection molding on the periphery of said framing means for engaging said carrier with, and disengaging said carrier from alignment means in a photolithographic device; means projecting inwardly from one of said framing means for engaging a first portion of the periphery of a photomask or a photomask/pellicle combination between said engaging means and said base, said engaging means being spaced a sufficient distance from said base to permit a photomask whose periphery is between said engaging means and said base to tilt away from said base without disengaging said first portion from said engaging means; means on the side of said base opposite said engaging means for movably engaging with, and disengaging from a second portion of the periphery of said photomask or said photomask/pellicle combination and, in combination with said engaging means, for holding said photomask or photomask/pellicle combination on said base; said carrier having a plurality of areas of substantially differing thicknesses precisely formed during injection molding, and a plurality of areas that are substantially flat, formed during said injection molding.

7. The photomask carrier of claim 6 further comprising cavity means in said framing means, and extending below the plane of said base a sufficient distance to permit reaching beneath a photomask or photomask/pellicle combination resting on said base and lifting said photomask or photomask/pellicle combination away from said base.

8. The photomask carrier of claim 6 further comprising cavity means in said framing means, and extending below the plane of said base a sufficient distance to permit reaching beneath a photomask or photomask/pellicle combination resting on said base and lifting said photomask or photomask/pellicle combination away from said base; and means on the periphery of said framing means for engaging said carrier with and disengaging said carrier from alignment means in a photolithographic device.

9. A kit comprising the carrier of claim 6 and a complementary container and container cover for said carrier, said container having a width approximating the width of said carrier, and means inside said container for holding the front and back of said carrier and any photomask or photomask/pellicle combination resting on the base of said carrier, away from the inner wall surfaces of said container.

10. An injection-molded, substantially one-piece photomask carrier including a base having an opening of sufficient size and shape to permit light to pass through in a photolithographic process; means joined to, upstanding from and framing the periphery of said base, said framing means having sufficient strength to protect and support the edges of a photomask or a photomask/pellicle combination resting on said base; means formed by injection molding on the periphery of said framing means for engaging said carrier with, and disengaging said carrier from alignment means in a photolithographic device; means projecting inwardly from one of said framing means for engaging a first portion of the periphery of a photomask placed between said engaging means in said base, and means on the side of said base opposite said engaging means for movably engaging with, and disengaging from a second portion of the periphery of said photomask and, in combination with said engaging means, for holding said photomask or photomask/pellicle combination on said base; said carrier having a plurality of areas of substantially differing thicknesses precisely formed during injection molding, and a plurality of areas that are substantially flat, formed during said injection molding.

11. A kit comprising the carrier of claim 10 and a complementary container and container cover for said carrier, said container having a width approximating the width of said carrier, and means inside said container for holding the front and back of said carrier and any photomask or photomask/pellicle combination resting on the base of said carrier, away from the inner wall surfaces of said container.

12. A kit comprising the carrier of claim 10 and a complementary container and container cover for said carrier, said container having means inside said container for holding the front and back of the carrier and any photomask or photomask/pellicle combination resting on the base of said carrier, away from the inner wall surfaces of said container.

13. A kit comprising the carrier of claim 10 and a complementary container and container cover for said carrier, said container having means inside said container for holding the front and back of said carrier, or said carrier and any photomask or photomask/pellicle combination resting on the base of said carrier, or any photomask/pellicle combination, away from the inner wall surfaces of said container.

* * * * *